US008455955B2

(12) United States Patent
Stribley et al.

(10) Patent No.: US 8,455,955 B2
(45) Date of Patent: Jun. 4, 2013

(54) TRANSISTOR ARRAY WITH SHARED BODY CONTACT AND METHOD OF MANUFACTURING

(75) Inventors: Paul Ronald Stribley, Plymouth (GB); John Nigel Ellis, Tavistock (GB)

(73) Assignee: X-Fab Semiconductor Foundries AG (DE)

( * ) Notice: Subject to any disclaimer, the term of this patent is extended or adjusted under 35 U.S.C. 154(b) by 717 days.

(21) Appl. No.: 12/306,947

(22) PCT Filed: Jun. 29, 2007

(86) PCT No.: PCT/GB2007/050369
§ 371 (c)(1),
(2), (4) Date: May 28, 2009

(87) PCT Pub. No.: WO2008/001142
PCT Pub. Date: Jan. 3, 2008

(65) Prior Publication Data
US 2009/0315080 A1    Dec. 24, 2009

(30) Foreign Application Priority Data
Jun. 30, 2006  (GB) .................................. 0612926.6

(51) Int. Cl.
*H01L 21/70*  (2006.01)
(52) U.S. Cl.
USPC ............................ 257/390; 257/401; 438/926
(58) Field of Classification Search
USPC .................. 257/205, 390, 401, 488; 438/926
See application file for complete search history.

(56) References Cited

U.S. PATENT DOCUMENTS

| 4,398,207 | A   | * | 8/1983 | Hoff et al. ..................... 257/379 |
| 6,040,991 | A   |   | 3/2000 | Ellis-Monaghan et al. |
| 6,097,066 | A   |   | 8/2000 | Lee et al. |
| 6,624,459 | B1  |   | 9/2003 | Dachtera et al. |
| 6,901,577 | B2  | * | 5/2005 | Kotani et al. ................. 257/390 |
| 7,701,034 | B2  | * | 4/2010 | Chuang et al. ................ 257/508 |

(Continued)

FOREIGN PATENT DOCUMENTS

| KR | 10-2006-0072679 | * | 6/2006 |
| WO | 2006/000993 A2 |   | 1/2006 |
| WO | 2006/000993 A3 |   | 1/2006 |

OTHER PUBLICATIONS

PCT, International Preliminary Report on Patentability, PCT/GB2007/050369 (12 pages) (Jan. 6, 2009).

(Continued)

*Primary Examiner* — Mark Prenty
(74) *Attorney, Agent, or Firm* — Thompson Hine L.L.P.

(57) ABSTRACT

An array of transistors arranged next to each other on a semiconductor material forming a substrate, the substrate comprising p-well or n-well diffusions forming a body, which diffusions are used as the body regions of the transistors, each transistor comprising a source, a drain and a gate, wherein the array of transistors further comprises at least one electrical connection to the body, wherein said electrical connection is shared by at least two transistors of said array. Also disclosed is a semiconductor device comprising at least one source, at least one drain, at least one gate between the at least one source and the at least one drain, and at least one structure of the same material as the at least one gate which does not have a connection means for electrical connection to the at least one gate.

14 Claims, 2 Drawing Sheets

U.S. PATENT DOCUMENTS

Figure 1:
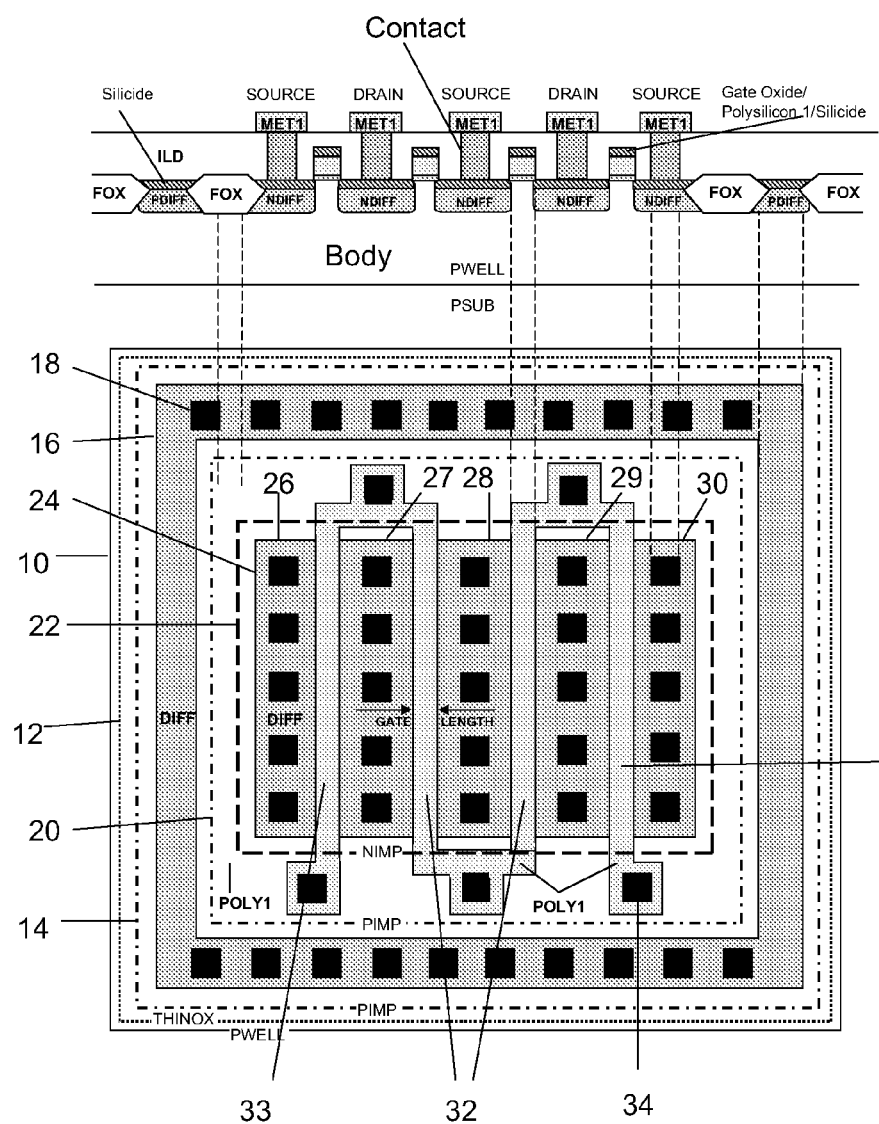

| | | | |
|---|---|---|---|
| 7,741,221 B2* | 6/2010 | Tian et al. | 438/689 |
| 8,105,757 B2* | 1/2012 | Choi | 430/311 |
| 2003/0080365 A1 | 5/2003 | Sakamoto et al. | |
| 2006/0084261 A1* | 4/2006 | Iwaki | 438/618 |
| 2006/0101356 A1* | 5/2006 | Allen et al. | 716/3 |

OTHER PUBLICATIONS

PCT, International Search Report, PCT/GB2007/050369 (dated Jul. 18, 2008; published Sep. 25, 2008).

* cited by examiner

NMOS
RF

CELL ARRAY

SUBSTRATE CONNECTION GRID

TRANSISTOR ARRAY WITH SHARED BODY CONTACT AND METHOD OF MANUFACTURING

The present invention relates to semiconductor devices. The invention finds particular application in CMOS transistors, in particular RF-CMOS transistors.

This application is the national stage filing of PCT International Application No. PCT/GB2007/050369, which in turn claims priority to Great Britain Application No. 0612926.6, filed on Jun. 30, 2006. The entire contents of both of these applications are incorporated herein by reference.

The major portion of the present specification refers to RF-CMOS transistors, but it will be understood that the invention is not necessarily limited thereto, but may find application in non-RF-CMOS technology, or indeed in technology which is not CMOS.

To optimise the performance of RF-CMOS the layout of the components should be carefully considered. RF-CMOS transistors should be very wide for high gain, but still compact to minimise parasitic capacitances. Therefore they are usually drawn such that the gate is formed by a set of parallel polysilicon gate stripes on a single device active area. A possible layout is shown in FIG. 1, in which the lower part shows a top view of an RF-CMOS transistor, and the upper part shows a sectional view, although for the sake of clarity of the drawing not all features shown in the top view are also shown in the sectional view, and vice versa.

The gate 31, 32, 33 of the transistor in FIG. 1 is formed by a meandering line of polysilicon. Most of this polysilicon line is formed over active area 24, resulting in (see FIG. 1) four parallel gate stripes 31, 32, 33. Five connection sites 34 are formed at the longitudinal ends of the gate stripes, just outside the active area 24.

Also formed over active area 24 are three source stripes 26, 28 and 30, and (in-between the source stripes) two drain stripes 27, 29, together constituting a source and a drain, respectively. Connections to the source and drain are made on opposite sides of the gate polysilicon 31, 32, 33 and in an alternating manner. This allows the drain or source of adjacent gate stripes to be shared, further minimising the parasitic capacitance. Connections to the gate are made either beyond the edges of the active area (as shown in the example of FIG. 1), or in some cases on the active area 24 itself. Gate series resistance should be minimised to optimise RF-CMOS as this is a parasitic resistance. Hence multiple gate connections are employed in the layout, as indicated by the connection sites (black squares) 34 (it will be appreciated that the gate material has a higher specific resistance than metal wiring leading to the connection sites).

Finally the body is connected as a generally ring-shaped active area 16, with appropriate doping (p+ for the p-well connections on NMOS—this is the example shown in FIG. 1—or n+ for n-well body on PMOS) which surrounds the CMOS component active area 24.

The present inventors have appreciated that there are some drawbacks associated with the device construction as described above.

Firstly, the body connection ring 16 is made to surround the active area 24. The body 10 (labelled PWELL in FIG. 1) of the component may be large for RF-CMOS transistors. Consequently the distance of the body connection (ring 16) to the innermost parts of the transistor may be large—resulting in a significant series resistance between the body connection in the circuit and the transistor. Certain embodiments of the present invention seek to address this problem by seeking to improve this parasitic series resistance to obtain the best RF-CMOS performance.

Secondly, the arrangement of the polysilicon gates as a grille of parallel stripes means that the local environment for the outermost stripes 31, 33 is quite different from that of the innermost 32. In order to make the device it is preferred to employ a pattern transfer process using a light sensitive chemical photoresist which is exposed with light with a pattern using a photo-projection aligner system. The resist is then developed to make the optical image on the silicon wafer, rather like a photographic film. Polysilicon etching then follows by exposing the wafer surface to a reactive ion environment. Areas where the photoresist pattern is left are protected from etching; the other areas are removed. The etching rate is dependent on the local environment. So polysilicon lines adjacent to large areas of polysilicon removal (i.e. the outer gate stripes 31, 33) will have a slightly different edge profile and line-width compared to lines (32) which are etched in the middle of the grille of lines.

In an RF-CMOS transistor made in this way, the differences in the transistor gate linewidth between the outermost elements 31, 33 of a grille and the innermost 32 means that in use the current flow in the component will be non-uniform. If the outer lines 31, 33 are a little larger than the innermost lines 32 a current crowding occurs in the device—since the current carrying capability (drive strength) of the inner lines 32 will be higher than that of the outer lines 31, 33. A non-uniformity of current flow in the device can be detrimental to the performance (self-heating causes current drive capability to be degraded) and also the reliability of the component. Localised current flow causes local heating and promotes failure of the component after long-term use, e.g. by electromigration of the metal connections made to the transistor.

Certain embodiments of the present invention also seek to address the abovementioned problem by optimising the polysilicon line uniformity in order to improve the RF-CMOS devices. The present invention aims to substantially equalise the current flow and drive strengths of the individual sections of the device. This also means that the power dissipation is substantially uniformly distributed over the entire component. This maximises the component reliability and performance.

Thirdly, the arrangement of the RF-CMOS transistor polysilicon lines as a grille causes further problems with the optical pattern-transfer process. The grille is usually at a pitch which is sufficient to cause diffraction of the light used to print the pattern. Regular grilles are ideal for creating diffraction gratings, but the consequence of printing the grille is that the diffraction of the light causes the grille pattern to be non-uniform. Edge elements of the grille are not exposed to as much light intensity as the innermost elements. Therefore the photolithographic process is challenged by the nature of the pattern. If a non-uniform grille is printed, the same consequences described above in connection with etch non-uniformity will occur, i.e. non-uniform linewidth resulting in non-uniform current carrying capability. Certain embodiments of the present invention also seek to address this third problem.

Aspects of the invention are set out in the independent claims.

One embodiment provides a semiconductor device comprising:
at least one source;
at least one drain;
at least one gate between the at least one source and the at least one drain; and at least one structure of the same material as the at least one gate, wherein the structure is not electrically connected to the at least one gate.

Another embodiment provides an array of transistors arranged next to each other on a semiconductor material forming a substrate, the substrate comprising p-well or n-well diffusions forming a body, which diffusions are used as the body regions of the transistors, each transistor comprising a source, a drain and a gate, wherein the array of transistors further comprises at least one electrical connection to the body, wherein said electrical connection is shared by at least two transistors of said array.

The shared connection may comprise wiring which connects areas of the body of the at least two transistors with each other so that the two or more connected transistors effectively become one (composite) transistor.

Alternatively, the shared connection comprises doped semiconductor material on the body, preferably extending towards, and more preferably reaching the body.

The shared connection may comprise a strip of doped semiconductor material extending between said at least two transistors. Preferably, the strip of doped semiconductor material extends generally perpendicular to a line through the centres of the at least two transistors, or on a mid-line between the at least two transistors.

Some preferred embodiments of the invention will now be described by way of example only and with reference to the accompanying drawings, in which:

FIG. 1 illustrates a possible layout of an RF-CMOS transistor; and

Figure 2:
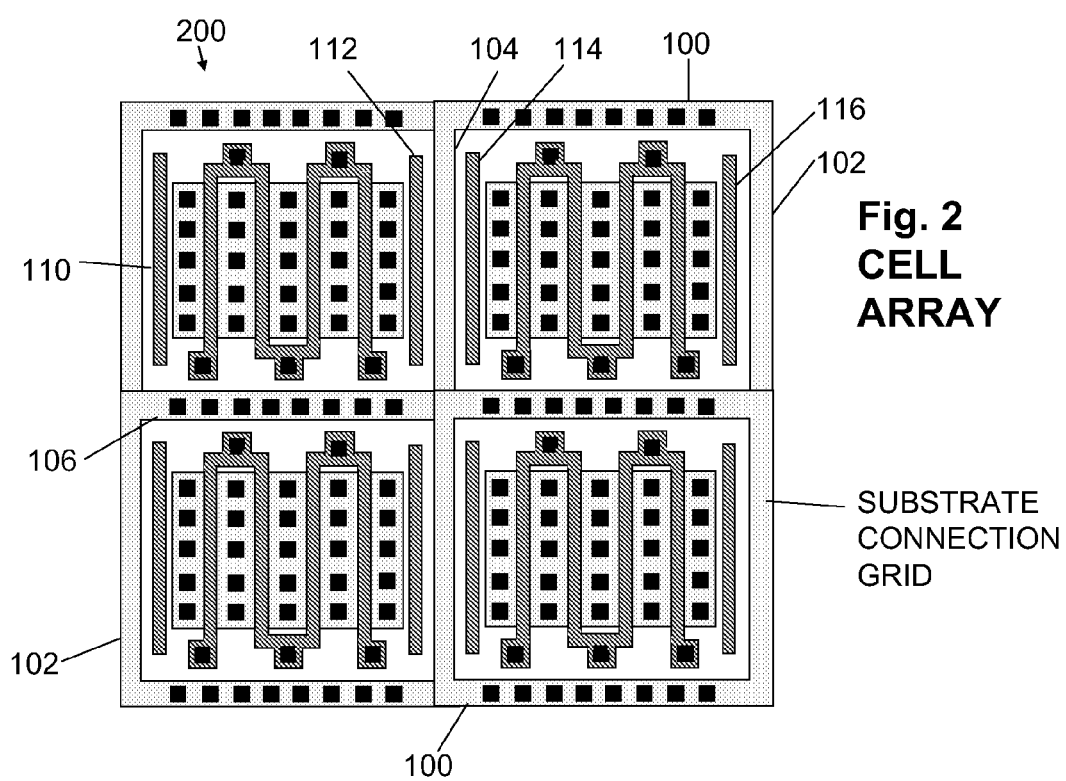

FIG. 2 schematically illustrates an embodiment according to the present invention.

The RF-CMOS transistor shown in FIG. 1 has already been described above. Some of the labels and abbreviations used in FIG. 1 are explained at this stage. They may aid in the understanding of the present invention since some features of embodiments of the present invention are based on the layout shown in FIG. 1. Where appropriate, two alternatives are explained, depending on whether the transistor is NMOS or PMOS, even if only one of these alternatives is shown in FIG. 1.

DIFF This layer describes the zone of "active area" which is the region of the silicon surface which is used to make devices.

POLY This is the doped polysilicon which is used to make transistor gates. The gate poly over the active area determines the transistor conducting channel.

THINOX (12) This is a region where the gate oxide is grown; this is the thin dielectric between the gate polysilicon and the silicon surface channel area.

NDIFF This is the region of heavy n+ doped semiconductor which is used for source or drain of an NMOS, and n-well connection for PMOS.

PDIFF This is the region of heavy p+ doped semiconductor which is used for source or drain of an PMOS and p-well connection for NMOS.

PWELL (10) This is the region of lighter doped p-type semiconductor which is used as the body of an NMOS.

NWELL This is the region of lighter doped n-type semiconductor which is used as the body of a PMOS.

NIMP (22) The highly n+ doped source or drain implantation layer for NMOS. Polysilicon stops the n+ entering the transistor channel region under the gate.

PIMP (14,20) The highly p+ doped source or drain implantation layer for PMOS. Polysilicon stops the p+ entering the transistor channel region under the gate.

FOX This is the field silicon dioxide layer which is used to isolate between components and between the active areas.

Silicide A metal-silicon compound which is a surface conducting layer used to reduce the resistance of the polysilicon gates, sources and drains.

Source Transistor connection on the lower voltage side for NMOS or the higher voltage side for PMOS.

Drain Transistor connection on the higher voltage side for NMOS or the lower voltage side for PMOS.

Body The diffused well region which forms the semiconductor region under the gates, source and drain diffusions. This is p-well for NMOS and n-well for PMOS.

Psub This is the p-type wafer substrate which is the doped silicon wafer on which the devices are made.

Contact (18,34) The contacts are metal filled holes in an insulating layer. They are drawn as small black boxes in the figures.

Metal (MET1) The wiring to the transistor is composed of tracks of metallisation (mainly aluminium). This connects to the contacts. In the lower part of FIG. 1 and in FIG. 2 the connecting metal shapes are omitted so as not to obscure the underlying transistor structure.

The embodiment shown in FIG. 2 illustrates that it is possible to reduce the substrate parasitic resistance by breaking the RF-CMOS device 200 up into sections, or cells. In the example shown in FIG. 2 there are 4 cells, but it will appreciated that more, or less, cells could be used. Also, while it is preferred that, as shown in FIG. 2, the cells are replicated in two dimensions (i.e. 2 cells next to each other in the left/right dimension in FIGS. 2 and 2 cells next to each other in the top/bottom dimension in FIG. 2) it is possible, pursuant to the invention, to replicate the cells in only one dimension.

The layout of the transistors in each cell closely resembles that shown in FIG. 1 and therefore corresponding features will not be described again.

Within each cell the RF-CMOS is drawn with compact design. Around each cell a substrate connection ring is drawn. The cells are tessellated (tiled) together to make a grid or array 200 of sub-components. In this manner the wiring into the substrate for the composite device forms a crossing grid of metal wiring connections, which lowers the series parasitic resistance of the substrate. Metal wiring has much lower resistance than diffusion doped silicon. This substrate connection grid arrangement for an array of cells can be seen in FIG. 2.

The substrate connection grid shown in FIG. 2 comprises the outer ring made up of (in FIG. 2 horizontal) portions 100 and (in FIG. 2 vertical) portions 102, and two crossing strips, (in FIG. 2 horizontal) strip 106 and (in FIG. 2 vertical) strip 104.

Since the distance from the centre of each cell (i.e. transistor) in FIG. 2 to the nearest body connection site is about half as long as the distance from the centre of the transistor of FIG. 1 to the nearest body connection site it is possible to reduce the parasitic resistance of the substrate significantly.

FIG. 2 also illustrates how, according to embodiments of the present invention, the manufacturability of the gate polysilicon can be improved. This is achieved by creating the individual RF-CMOS transistor cells with dummy polysilicon lines 110, 112, 114, 116 adjacent to the outermost gate polysilicon elements of each of the transistor cells. When the cells are tiled together the dummy polysilicon bars form a substantially uniform grille of polysilicon lines. That is, the (in FIG. 2 vertical) portions of the gate of each transistor and the dummy polysilicon lines 110, 112, 114, 116 together form a grille of substantially equidistant polysilicon lines. The outermost polysilicon elements in the composite array are then simply dummy lines, i.e. they are not connected to the gate, and have no specific provision for being so connected. However, they are created by the same processing steps as the gates (e.g. creating a photoresist pattern and then etching), i.e. they are structures of the same material as the gate stripes. Whilst not essential, it is also preferred that the dummy lines have the same size and/or shape as the gate stripes.

If the pattern transfer process (photo or etch) causes problems for the outer lines (i.e. makes the outer lines non-uniform/different from the remaining lines), then the transistor itself will be unaffected because the actual component gate polysilicon lines are inset within the array of lines. The outermost lines of the array do not take part in the operation of the device.

Thus the transistor gate lines will be substantially uniformly printed and etched—and thus the device is optimised for manufacturability. As shown in FIG. 2, the distance between the inner dummy lines 112, 114 is the same as the distance between the gate stripes.

The dummy lines situated between the cells of the composite transistor make the grille uniform to ensure that all the inner gate polysilicon lines experience the same local environment through the manufacturing process. Hence this technique also ensures that all gate stripes throughout the component can be made of equal dimension.

The cells are organised so that the source connections of the transistor in every cell are made in the outermost portions of the active area and that the drain connections are made to inner shared diffused parts. This minimises the drain parasitic capacitance (parasitic capacitance for the diffused transistor junctions is larger for outer active area edges than for portions towards the centre of the active area). The transistor source is, in general, not switched in the RF device and hence the higher value parasitic junction edges can be used for the source. However the drain connection is switched regularly and this should be formed in the inner junction areas with the smallest parasitic capacitance, to maximise the switching performance capability.

Whilst in FIG. 2 an embodiment is shown which is formed with an outer body connection ring and two crossing strips separating the transistors from each other (and thus forming complete rings of body connections around each transistor), it will be appreciated that other embodiments of the invention are not formed with complete rings around each transistor of the array. In particular, the body connections associated with each individual transistor could comprise only parallel stripes (e.g. only the in FIG. 2 horizontal stripes). Similarly it would be possible to provide metal connection sites around the entire ring of each transistor (i.e. also in the vertical portions of the body connection grid of FIG. 2). Alternatively, it would be possible to provide less connection sites than shown in FIG. 2.

While the embodiment shown in FIG. 2 both shows an arrangement of tessellated transistors and shows transistors with dummy gate lines it will be appreciated that these features are useful on their own, not only in combination.

Further, whilst it is preferred to provide a dummy gate stripe on both sides of each transistor, an partial improvement over earlier techniques can be achieved by providing a dummy gate stripe on only one side of the transistor.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. An array of transistors arranged next to each other on a semiconductor material forming a substrate, the substrate comprising p-well or n-well diffusions forming a body, which diffusions are used as the body regions of the transistors, each transistor comprising a source, a drain and a gate, wherein the array of transistors further comprises at least one electrical connection to the body, wherein said electrical connection is shared by at least two transistors of said array, wherein the gate of each transistor of the array comprises several gate portions, the array further comprising at least one structure of the same material as the gate portions, wherein the gate portions of at least two transistors of the array and the at least one structure form a plurality of substantially equidistant stripes.

2. An array of transistors according to claim 1, wherein said shared connection comprises wiring which connects areas of the body of said at least two transistors with each other.

3. An array of transistors according to claim 1 wherein said shared connection comprises doped semiconductor material on said body.

4. An array of transistors according to claim 3 wherein said shared connection comprises a strip of doped semiconductor material extending between said at least two transistors.

5. An array of transistors according to claim 4, wherein said shared connection comprises a ring of doped semiconductor material extending around at least one of said transistors preferably around at least two of said transistors.

6. An array of transistors according to claim 3, wherein the shared connection comprises doped semiconductor material arranged in the form of a grid, wherein a said transistor is located within each loop of the grid.

7. An array of transistors according to claim 3, wherein the array is a 2×2 array of transistors, wherein the shared connection comprises a ring of doped semiconductor material extending around all four transistors, and an arrangement of two crossing strips of doped semiconductor material separating the transistors from each other.

8. An array of transistors according to claim 1, wherein the stripes are arranged in a two-dimensional array, wherein the stripes of said two-dimensional array are equidistant in two dimensions.

9. An array of transistors according to claim 1, wherein the at least one structure does not have a connection means for electrical connection to the gate portions.

10. An array of transistors according to claim 1, wherein the source, drain and gate of each transistor are located within an active area, and wherein the at least one structure is located outside the active area.

11. A semiconductor device comprising:
a substrate;
at least two transistors arranged next to each other on the substrate, the substrate comprising a body comprising body regions for the transistors; and
at least one electrical connection to the body between the at least two transistors, wherein the at least one electrical connection to the body is shared by the at least two transistors,
wherein each transistor comprises:
a source;
a drain; and
a gate between the source and the drain;

wherein the semiconductor device further comprises at least one structure of the same material as the gate which does not have a connection means for electrical connection to the gate.

12. A semiconductor device according to claim 11, wherein the source, the drain and the gate are located within an active area, and wherein the at least one structure is located outside the active area.

13. An array according to claim 1, wherein the at least one structure is formed such that a line width uniformity of the stripes and/or uniformity in the distance between the stripes is promoted.

14. An array of transistors according to claim 1, wherein the array of transistors are formed in RF-CMOS technology.

* * * * *